US006802363B1

(12) United States Patent
Wang

(10) Patent No.: US 6,802,363 B1
(45) Date of Patent: Oct. 12, 2004

(54) FLAT TYPE HEAT PIPE WITH OPENING

(76) Inventor: Pei Choa Wang, 14F-3, No. 9, Hsin Fu I St., Ping Jen, Tao Yuan Hsien (TW)

( * ) Notice: Subject to any disclaimer, the term of this patent is extended or adjusted under 35 U.S.C. 154(b) by 0 days.

(21) Appl. No.: 10/452,513

(22) Filed: Jun. 3, 2003

(51) Int. Cl.[7] .......................... F28D 15/00; F28F 7/00; H05K 7/20; H01B 7/42

(52) U.S. Cl. .......................... 165/104.26; 165/104.21; 165/76; 361/700; 174/15.2

(58) Field of Search ...................... 165/104.26, 104.33, 165/104.21, 80.3, 76, 67, 166, 167, 46; 361/700, 707; 257/714, 715, 719; 174/15.2; 220/577, 289, 796; 248/544

(56) References Cited

U.S. PATENT DOCUMENTS 3,459,295 A * 8/1969 Cousar ...................... 206/219
5,256,902 A * 10/1993 Culver ...................... 257/722
5,308,920 A * 5/1994 Itoh .......................... 174/15.2
5,815,921 A * 10/1998 Burward-Hoy ........ 29/890.046
6,182,748 B1 * 2/2001 Brost et al. ................ 165/167
6,269,866 B1 * 8/2001 Yamamoto et al. .... 165/104.26
6,302,192 B1 * 10/2001 Dussinger et al. ..... 165/104.26
6,535,386 B2 * 3/2003 Sathe et al. ................ 361/700
6,650,544 B1 * 11/2003 Lai ............................ 361/700

* cited by examiner

Primary Examiner—Henry Bennett
Assistant Examiner—Tho v Duong
(74) Attorney, Agent, or Firm—Rosenberg, Klein & Lee

(57) ABSTRACT

A flat type heat pipe with opening includes a thermal sink making working fluid flow to follow a thermal transformation cycle by capillarity; a support portion is fixedly arranged the thermal sink; a housing module is made of a good heat conductibility material, having a first housing or a second housing, for receiving the support portion or the thermal sink therein; the housing module is having at least one opening or a hollow conductible body on the opening.

7 Claims, 6 Drawing Sheets

FLAT TYPE HEAT PIPE WITH OPENING

BACKGROUND OF THE INVENTION

1. Field of the Invention

The present invention relates to a flat type heat pipe with opening, and in particular to a flat type heat pipe adapted for use in an electronic element or the electronic element with wires, which passes through the opening of flat type heat pipe, to contact another thermal generating device or mechanical-electrical device.

2. Description of the Prior Art

Please refer to the FIG. 1, there is a suitable thermal sink or working fluid (not shown) arranged within the conventional heat pipe, the thermal sink is a metal net with capillarity; thereby the capillarity of the thermal sink can transform the thermal quality to a radiator outside 2A.

Thus, a heat pipe 1A according to the prior art only adapts for being made of a pipe shape, however, today the requirements of electronic products have a limitation direct to light, thin and nano could not have been reached, so that we have a flat type heat pipe 3A, (as shown in FIG. 2 or FIG. 3), the flat type heat pipe is formed by a support portion 30A or a housing module 31A, the support portion 30A has a metal net with capillarity, etc. Following the requirement of thermal radiation path, a plurality of hole 32A is stamping on the support portion 30A.

However, the taught heat pipe 1A or the taught flat type heat pipe 3A of above description, (it is) not only having a defect of deformation by negative pressure, but also having the bad properties of heat radiation transformation, which the high thermal resistance of contact, unstable of capillarity, difficult to manufacture, high cost and weld to decrease the effective of heat radiation, and do not adapt for the electronic elements or central processing units with higher temperature, for dissipating heat rapidly.

Accordingly, as above description we knowing the flat type heat pipe known in the prior art having exists a non-convenience and defect in using practically.

Therefore, the present invention is directed to an improved the flat type heat pipe with the inventor's research hardly and the application of theorem providing a flat type heat pipe with opening, (it is) directly to improve the housing module of flat type heat pipe structure, having a reasonable design and simpler thermal radiation structure, to adapt for each of the electronic elements or thermal generating device with wires or to contact with both thermal generating device for dissipating heat, to effectively improve the defect in the prior art.

SUMMARY OF THE DISCLOSURE

It is an object of the present invention to provide a flat type heat pipe with opening, the flat type heat pipe structure is having at least one opening to penetrate the housing module, thereby the wires of the thermal generating device or the mechanical-electrical device can pass through the opening and contact with another thermal generating device or mechanical-electrical device; to reach the function of thermal dissipating and correspond to the trend of micro scale thermal dissipating module.

It is another object of the present invention to provide a flat type heat pipe with opening, wherein the flat type heat pipe structure has at least one opening to penetrate therein, to receive the wires or the electronic elements. Moreover, the opening is integrally formed by stamping process or using the rivet with hollow to form by stamping process; the housing module matches with the mechanical-electrical device, which wanted to be mounted for suitable change or manufactures, to reach the purpose of simple structure, large area for dissipating heat, high efficient of thermal convection and integrally formed by stamping process with low cost.

In order to achieve the above objectives of the invention that providing a flat type heat pipe with opening, which is including a thermal sink making working fluid flow to follow a thermal transformation cycle by capillarity; a support portion fixedly arranged with the thermal sink; a housing module received the thermal sink or the support portion therein; characterized in that a first housing is made of a good heat conductibility plate with a round shape, including at least one opening thereon, and a second housing is including at least one opening thereon or including a heat conductibility body with hollow on the opening, for positioning the first housing fixedly on a top side cavity of the second housing, sealed by welding or stamping of mechainical process forming a closed, to receive the support portion or the thermal sink or working fluid therein.

In the cause of examiner or judge can further knowing in other objects, feathers and technological subject matters of the invention will be apparent from the following detailed description taken in connection with the accompanying drawings. However, the present examples and embodiments are to be considered in all respects as illustrative and not restrictive, and the invention is not to be limited to the details given herein.

BRIEF DESCRIPTIONS OF THE DRAWINGS

The present invention can be fully understood from the following detailed description and preferred embodiment with reference to the accompanying drawings in which.

DETAILED DESCRIPTION OF THE PREFERRED EMBODIMENTS

Figure 1:
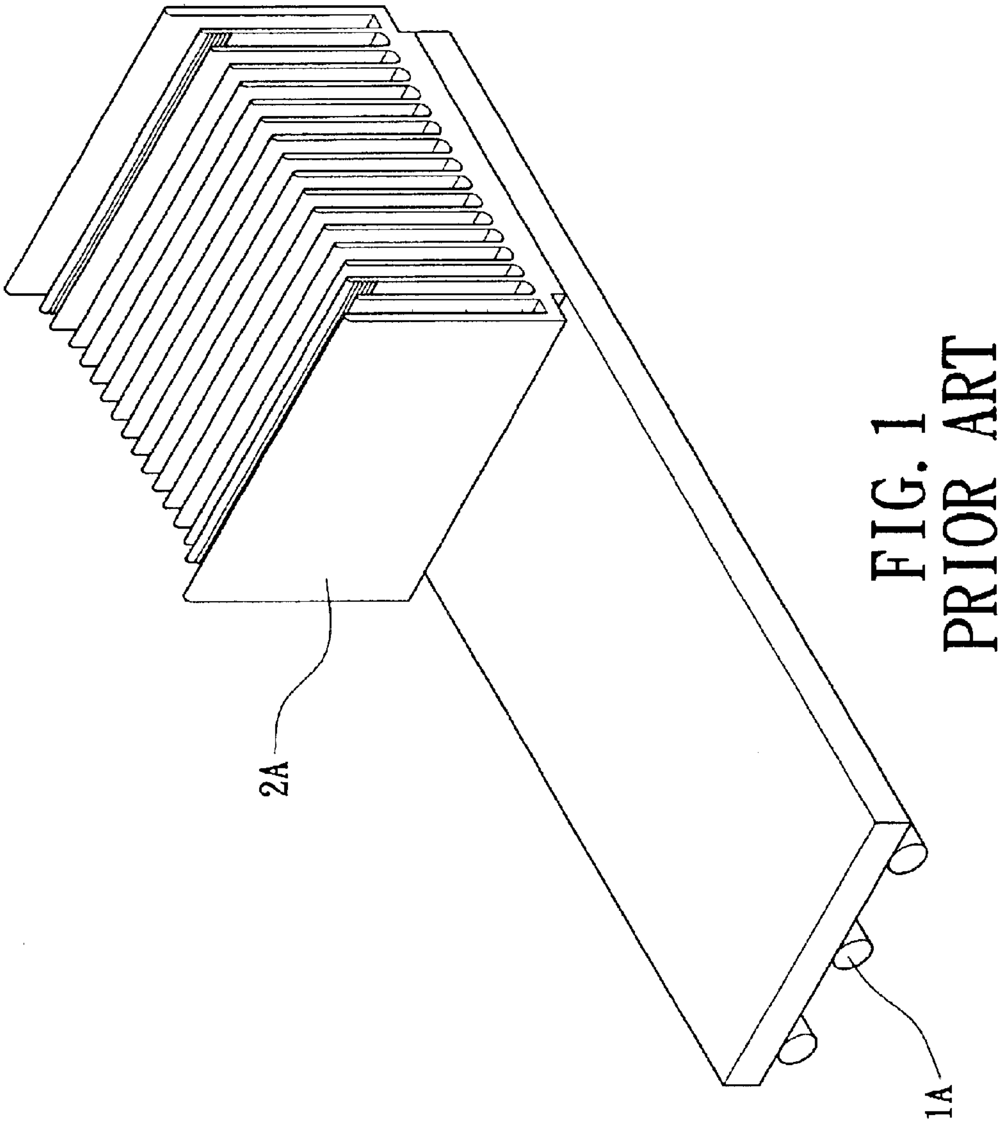
FIG. 1 PRIOR ART
FIG. 1 is a perspective view of a conventional heat pipe structure.
Figure 2:
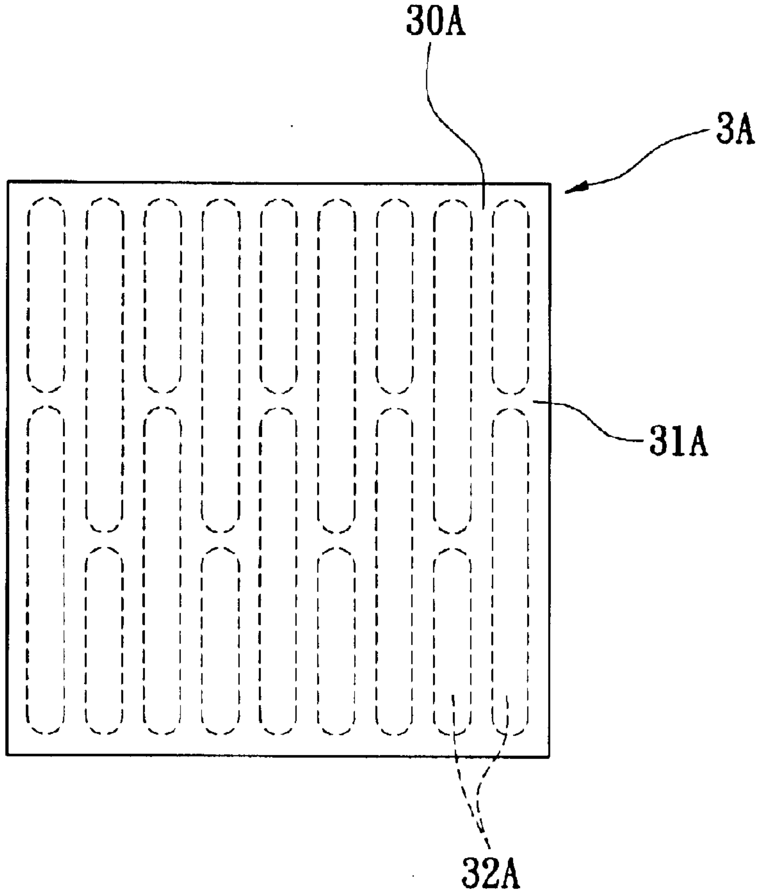
FIG. 2 PRIOR ART
FIG. 2 is a perspective view of another conventional flat type heat pipe structure.
Figure 3:
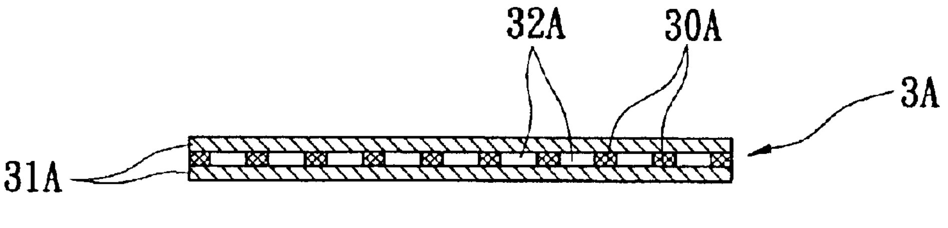
FIG. 3 PRIOR ART
FIG. 3 is a perspective view of another conventional flat type heat pipe structure.
Figure 4:
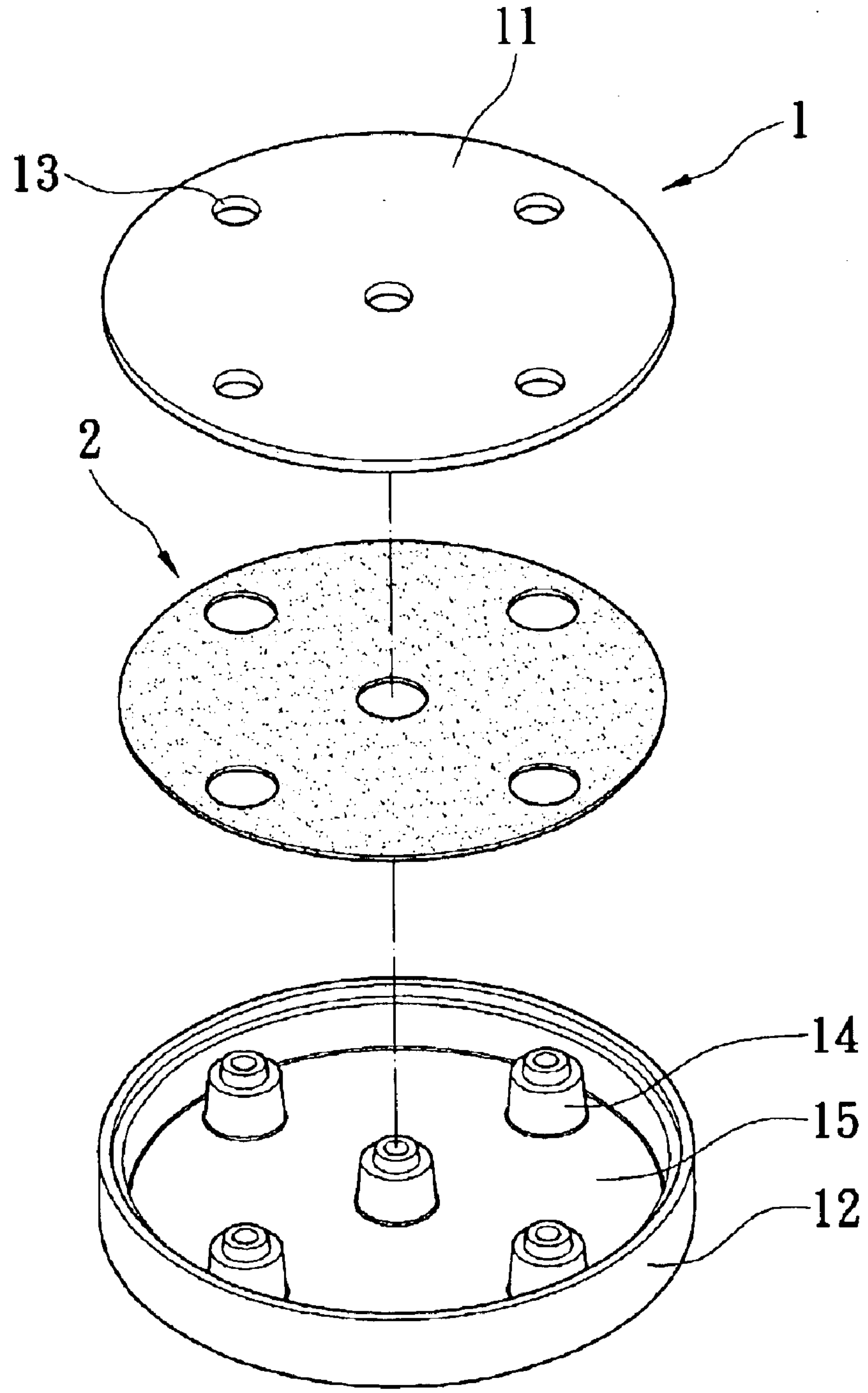
FIG. 4 is an exploded view according to the present invention.
Figure 5:
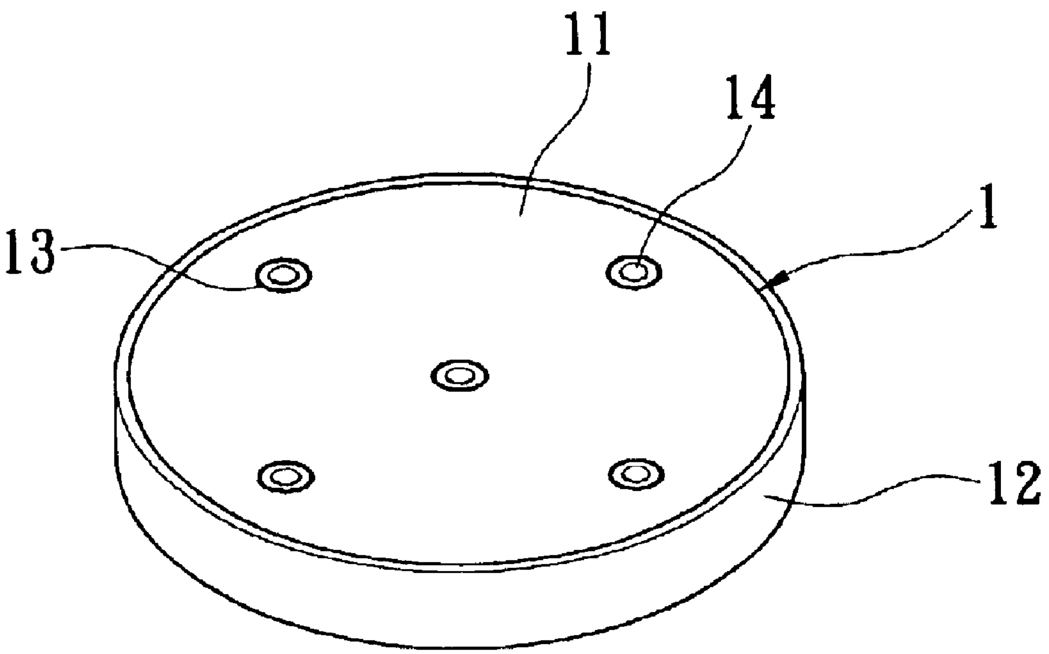
FIG. 5 is a perspective view according to the present invention.
Figure 6:
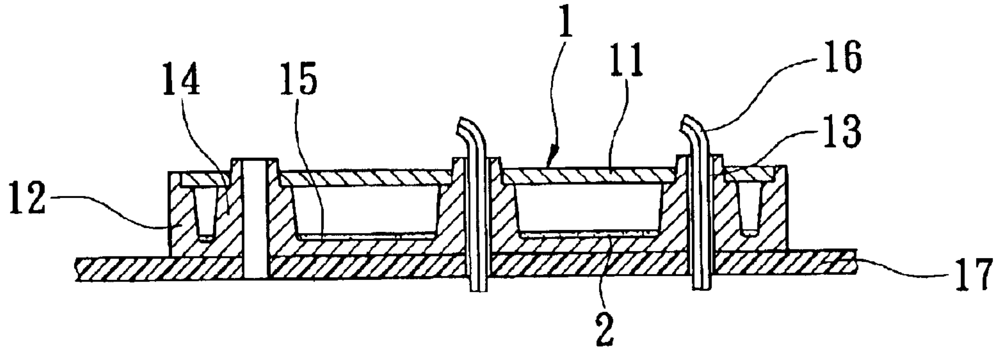
FIG. 6 is a local cross-sectional view according to the present invention.

The following detailed description is of the best presently contemplated modes of carrying out the invention. This description is not to be taken in a limiting sense, but is made merely for the purpose of illustrating general principles of embodiments of the invention. The scope of the invention is best defined by the appended claims.

Although the embodiments of the present invention are described below in connection with a flat type heat pipe with opening, the present invention can be applied to all the electronic elements with wires or thermal generating device with wires or contacted with both thermal generating device for dissipating heat and making the wires passing through the opening, including but not limited to a light emitting diode (LED), a liquid crystal display (LCD), a light bulb, a boiler pipe, a heat exchanger pipe, a thermal generating curved pipe, as well as all other thermal generating devices or mechanical-electrical devices.

Please refer to FIGS. 4–7 illustrate a flat type heat pipe with opening, wherein the flat type heat pipe is having a housing module 1, and the housing module 1 is further having a first housing 11 or a second housing 12. At least one opening 13 is integrally formed by stamping on the first housing 11. The second housing 12 is having a bottom plate 15 integrally formed with a side of the second housing 12, there is at least one opening 13 on the bottom plate 15, a heat conductibility body with hollow 14 is fixedly connected with the opening 13. The first housing 11 is fixedly arranged on a top side of the second housing 12, sealed by welding or stamping of mechanical process forming a closed with the second housing 12, to receive a thermal sink 2 or working fluid therein. Moreover, an axis of the heat conductibility cylinder body with hollow 14 of the second housing 12 is at the same line with a center of the opening 13 of the first housing 11 when fabrication, to make the heat conductibility cylinder body with hollow 14 of the second housing 12 mounted into the opening 13 of the first housing 11. Wires 16 or connection terminals (not shown) can pass through the opening 13 and the heat conductibility cylinder body with hollow 14 to project from a side of the housing module 1, and connect to another mechanical-electrical device or thermal generating device. The flat type heat pipe with opening can arrange on a thermal generating base 17, to increase the thermal dissipating contacted area.

Figure 7:
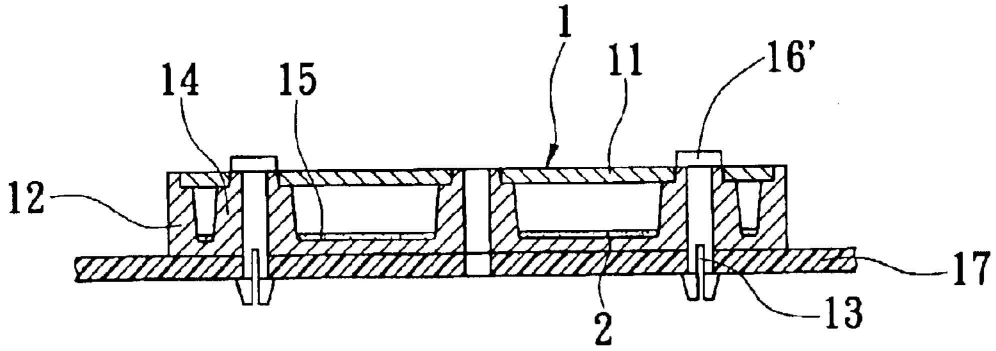
FIG. 7 is another local cross-sectional view according to the present invention with hollow rivets.

The thermal sink 2 is made of a good heat conductibility metal net with capillarity, fixedly arranged within the housing module 1, for providing the working fluid flow to follow a thermal transformation cycle by capillarity, to reach the best efficiency of thermal cycling. As shown in FIG. 7, the opening 13 is also stamped by a rigid body (not shown) with hollow or a rivet 16' with hollow or screwed by screw (not shown).

Figure 8:
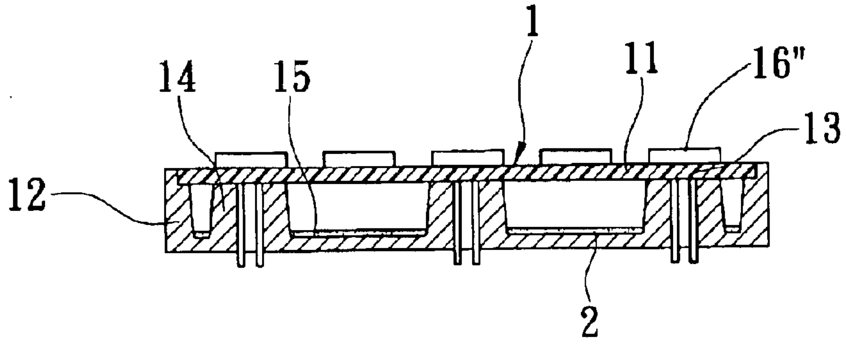
FIG. 8 is another local cross-sectional view according to the present invention.

Please refer to FIG. 8 illustrates another embodiment of the present invention, at least one electronic element 16" is fixedly arranged on the housing module 1, each of the conduction portion of the electronic clement 16" passes through the opening 13 and the heat conductibility cylinder body with hollow 14 to project from another side of the housing module 1, which is electrically connected to another mechanical-electrical device.

Figure 9:
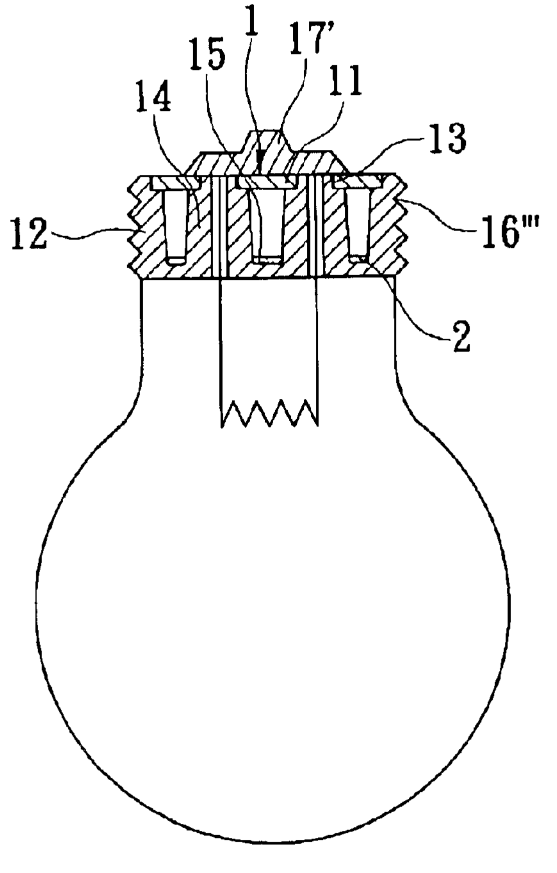
FIG. 9 is another local cross-sectional view according to the present invention.

Please refer to FIG. 9 illustrates another embodiment of the present invention, a conduction portion of a light bulb 16''' is fixedly arranged on the opening 13 of the present invention, wherein the second housing 12 is further including a thread of a screw on a curved surface side for screwing, the housing module 1 is including a projection electrode 17', for providing electrically contacted. Thereby, a combination of the light bulb 16''' and the present invention gets a special function for dissipating heat.

A prototype of flat type heat pipe with opening has been constructed herein with feathers as above descriptions, the present invention is with the opening on the housing module, therefore the wires of the thermal generating device or the mechanical-electrical device can pass through the opening and connect electrically with another mechanical-electrical device, to get the function for dissipating heat. Moreover, the opening is by means of stamping process in unity or integrally stamped by the rivets with hollow or the rigid bodies with hollow; the housing module matches with the mechanical-electrical device, which wanted to be mounted for suitable change or manufacture, to reach the purpose of simple structure, large area for dissipating heat, high efficient of thermal convection and integrally formed by stamping process with low cost. Simultaneously, the present invention is also reduced the volume of flat type heat pipe substantially, for corresponding to the fashion of modern.

Although particular embodiment of the invention has been described in detail for purpose of illustration, various modifications and enhancements maybe made without departing from the spirit and scope of the invention. Accordingly, the invention is not to be limited except as by the appended claims.

What is claimed is:

1. A flat type heat pipe, comprising;

a thermal sink for providing a capillary action of a working fluid inside the flat type heat pipe; and a housing module having a receiving cavity formed therein, said thermal sink being positioned in said receiving cavity of said housing module, said housing module comprising:

a first housing including a plate having at least one first opening formed therein, and a second housing including a bottom plate and a threaded side wall integrally attached by a bottom edge thereof to said bottom plate along the periphery thereof, said bottom plate having at least one second opening formed therein in alignment with said at least one first opening of said first housing, said second housing further including at least one hollow body extending from said bottom plate of said second housing in alignment with said at least one second opening, wherein when said first housing is attached to said threaded side wall of said second housing at a top edge thereof, said at least one hollow body is brought in engagement with said at least one first opening.

2. The flat type heat pipe as claimed in claim 1, wherein the housing module is formed in a cylinder shape.

3. The flat type heat pipe as claimed in claim 1, wherein said plate of the first housing has a round shape and is made of a heat conductive material.

4. The flat type heat pipe as claimed in claim 1, wherein the second housing is formed as a hollow cylinder with said bottom plate made from a heat conductive material.

5. The flat type heat pipe as claimed in claim 1, wherein the first housing is attached to the second housing, and said housing module is sealed by means of welding or stamping to form said receiving cavity between said first and second housings.

6. The flat type heat pipe as claimed in claim 1, wherein an axis of said at least one hollow body of the second housing coincides with a center of said at least one first opening of the first housing.

7. The flat type heat pipe as claimed in claim 1, further comprising at least one rigid body with a hollow, said at least one rigid body protruding through both said at least one first and second openings.

* * * * *